(12) United States Patent
Tsai et al.

(10) Patent No.: US 10,488,457 B2
(45) Date of Patent: Nov. 26, 2019

(54) CIRCUIT TEST SYSTEM AND METHOD

(71) Applicant: Primax Electronics Ltd., Taipei (TW)

(72) Inventors: Cheng-Yi Tsai, Taipei (TW); Ying-Che Tseng, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 63 days.

(21) Appl. No.: 15/993,354

(22) Filed: May 30, 2018

(65) Prior Publication Data
US 2019/0317145 A1 Oct. 17, 2019

(30) Foreign Application Priority Data

Apr. 13, 2018 (TW) .............................. 107112778 A

(51) Int. Cl.
| | |
|---|---|
| *G01R 31/28* | (2006.01) |
| *G01R 1/073* | (2006.01) |
| *G01R 1/067* | (2006.01) |
| *G01L 1/22* | (2006.01) |

(52) U.S. Cl.
CPC ..... *G01R 31/2808* (2013.01); *G01R 1/06722* (2013.01); *G01R 1/07328* (2013.01); *G01L 1/22* (2013.01)

(58) Field of Classification Search
CPC .... G01R 31/28; G01R 31/2808; G01R 1/073; G01R 1/07328; G01R 1/067; G01R 1/06722; G01L 1/22
See application file for complete search history.

(56) References Cited

U.S. PATENT DOCUMENTS

| | | | |
|---|---|---|---|
| 7,126,360 B1* | 10/2006 | Yang .................. | G01R 1/06766 324/754.07 |
| 2016/0131681 A1* | 5/2016 | Chang ...................... | G01R 1/18 324/750.26 |

FOREIGN PATENT DOCUMENTS

JP 07151822 A * 6/1995

* cited by examiner

*Primary Examiner* — Son T Le
(74) *Attorney, Agent, or Firm* — Kirton McConkie; Evan R. Witt

(57) ABSTRACT

A circuit test system is provided for testing a circuit of a circuit board. The circuit test system includes a test platform, a pressing plate and a computing device. The test platform includes plural contact elements. Each contact element includes a strain gauge and a pogo pin. During the process of testing the circuit board, a test program of the computing device monitors and reads a pressure value, a downward displacement and an impedance value of the contact element. Moreover, the test program judges whether the function of the contact element is normal according to the pressure value, the downward displacement and the impedance value.

19 Claims, 7 Drawing Sheets

CIRCUIT TEST SYSTEM AND METHOD

FIELD OF THE INVENTION

The present invention relates to a field of testing a circuit, and more particularly to a system for testing a circuit of a circuit board.

BACKGROUND OF THE INVENTION

With increasing development of science and technology, computers and their peripheral devices are widely and deeply applied to all families and all industries. During the process of fabricating a computer and the peripheral devices, it is important to quickly test the circuits of the circuit board of the computer and the peripheral devices in order to assure the normal operations of the computer and the peripheral devices.

Conventionally, the circuit board is placed in an in circuit tester (ICT) or a functional circuit tester (FCT), and the electrical properties of the circuit board are tested by the in circuit tester or the functional circuit tester. The bed of nails in a test platform of the in circuit tester or the functional circuit tester is electrically contacted with pre-defined test points of the circuit board in order to test whether the electronic components or the circuits of the circuit board are normal. Consequently, during the process of assembling the circuit board, the problems associated with non-wet open, the solder short, misalignment, missing parts or wrong parts will be reduced.

For increasing the testing accuracy of the in circuit tester or the functional circuit tester, the stress provided to the bed of nails or the pressing element is usually provided by an external instrument. Consequently, the external instrument judges whether the pressed circuit board is in a horizontal state.

However, since the external instrument is only able to judge whether the circuit board is in flat placement, some drawbacks occur. For example, if the bed of nails in a test platform of the in circuit tester or the functional circuit tester malfunctions or the bed of nails is not accurately in electrical contact with the circuit board, the test worker cannot realize the abnormal condition of the bed of nails. Under this circumstance, an erroneous test result is generated. Consequently, during the process of testing the circuit of the circuit board, it is important to place the circuit board on the same horizontal plane while monitoring the contact element. For example, it is necessary to monitor the function of the bed of nails and assure that the contact element is accurately in electrical contact with the circuit board.

SUMMARY OF THE INVENTION

The present invention provides a circuit test system for testing the circuit of a circuit board. During the process of testing the circuit of the circuit board, the circuit test system is capable of monitoring whether the contact element is normally operated and assuring that the contact element is accurately in electrical contact with the circuit board.

In accordance with an aspect of the present invention, there is provided a circuit test system for testing a circuit of a circuit board. Moreover, plural test points are formed on the circuit of the circuit board. The circuit test system includes a test platform, a pressing plate and a computing device. The test platform includes plural contact elements corresponding to the plural test points. Each of the plural contact elements includes a strain gauge and a pogo pin. A pressure value of each of the plural contact elements is detected by the corresponding strain gauge. The pogo pin is disposed on the strain gauge. A downward displacement and an impedance value of each of the plural contact elements are detected by the pogo pin. The pogo pin is electrically contacted with the corresponding test point. When the circuit board is pressed by the pressing plate, the plural contact elements are pressed by the corresponding test points. The computing device is electrically connected with the test platform and the pressing plate. A test program is executed in the computing device. When the plural contact elements are electrically contacted with the corresponding test points to test the circuit of the circuit board, the test program monitors and reads the pressure value, the downward displacement and the impedance value and judges whether the pressure value, the downward displacement and the impedance value are equal to a standard pressure value, a standard downward displacement and a standard impedance value, respectively.

In an embodiment, the strain gauge includes a strain plate that detects the pressure value.

In an embodiment, the pogo pin includes a plunger, a spring and a main body. The plunger detects the impedance value. The spring detects the downward displacement. The main body includes an opening and an accommodation space. The plunger and the spring are accommodated within the accommodation space. A portion of the plunger is protruded out of the opening and contacted with the spring. Consequently, the plunger is movable within the accommodation space in a reciprocating manner.

In an embodiment, when the pogo pin of each contact element is in a completely-released state, the pressure value, the downward displacement and the impedance value read by the test program are respectively defined as the standard pressure value, the standard downward displacement and the standard impedance value corresponding to the completely-released state of the pogo pin.

In an embodiment, when the pogo pin of each contact element is in a completely-compressed state, the pressure value, the downward displacement and the impedance value read by the test program are respectively defined as the standard pressure value, the standard downward displacement and the standard impedance value corresponding to the completely-compressed state of the pogo pin.

In an embodiment, the test platform includes plural positioning posts, which are arranged around the plural contact elements. The circuit board includes plural positioning holes corresponding to the plural positioning posts. The plural positioning posts are penetrated through the corresponding positioning holes. Consequently, the circuit board is positioned over the plural contact elements.

In an embodiment, the plural positioning posts include respective base parts and respective positioning ends, wherein the positioning ends are coaxially disposed on the corresponding base parts.

In an embodiment, the positioning ends of the positioning posts are penetrated through the corresponding positioning holes, so that the circuit board is movable relative to the positioning ends in a reciprocating manner.

In an embodiment, when the test program controls the plural contact elements to be electrically contacted with the corresponding test points to test the circuit of the circuit board, a test record is generated and stored in the computing device.

In an embodiment, if the test program judges that the pressure value, the downward displacement and the impedance value of each contact element are not respectively equal to the standard pressure value, the standard downward displacement and the standard impedance value, an abnormal signal is generated and stored in the computing device.

In an embodiment, the circuit test system further includes a control platform, and the test record or the abnormal signal is transmitted from the test program to the control platform in a wired transmission manner or a wireless transmission manner.

In an embodiment, the control platform is a cloud server or a mobile device.

In an embodiment, the mobile device is a notebook computer, a tablet computer, a personal digital assistant or a smart phone.

In an embodiment, plural elastic pressing posts are protruded from a surface of the pressing plate. When the circuit board is pressed by the elastic pressing posts, the contact element is pressed by the test point.

In accordance with another aspect of the present invention, there is provided a circuit test method for testing a circuit of a circuit board. Moreover, plural test points are formed on the circuit of the circuit board. The circuit test method includes the following steps. In a step (a), a test platform is provided. The test platform includes plural contact elements. The plural contact elements include plural strain gauges and plural pogo pins on the corresponding strain gauges. In a step (b), detection values of the strain gauges are calibrated, so that the pogo pins of the contact elements are located at the same horizontal plane. In a step (c), a pressure value, a downward displacement and an impedance value of each of the plural contact elements are read, and the pressure value, the downward displacement and the impedance value of each of the plural contact elements are defined as a standard pressure value, a standard downward displacement and a standard impedance value, respectively. In a step (d), the standard pressure value, the standard downward displacement and the standard impedance value are stored. In a step (e), the standard pressure value, the standard downward displacement and the standard impedance value are loaded. In a step (f), the circuit board is tested, and the pressure value, the downward displacement and the impedance value are monitored and read. Then, a step (g) is performed to judge whether the pressure value, the downward displacement and the impedance value are respectively equal to the standard pressure value, the standard downward displacement and the standard impedance value. If the judging condition of the step (g) is not satisfied, an abnormal signal is generated. If the judging condition of the step (g) is satisfied, a next step is performed. In a step (h), a test record is generated.

Preferably, in the step (g), the abnormal signal is transmitted to a control platform in a wired transmission manner or a wireless transmission manner.

Preferably, in the step (h), the test record is transmitted to a control platform in a wired transmission manner or a wireless transmission manner.

Preferably, in the step (c), the pressure value, the downward displacement and the impedance value of each contact element corresponding to a completely-released state of the pogo pin are read and defined as the standard pressure value, the standard downward displacement and the standard impedance value corresponding to the completely-released state of the pogo pin.

Preferably, in the step (c), the pressure value, the downward displacement and the impedance value of each contact element corresponding to a completely-compressed state of the pogo pin are read and defined as the standard pressure value, the standard downward displacement and the standard impedance value corresponding to the completely-compressed state of the pogo pin.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
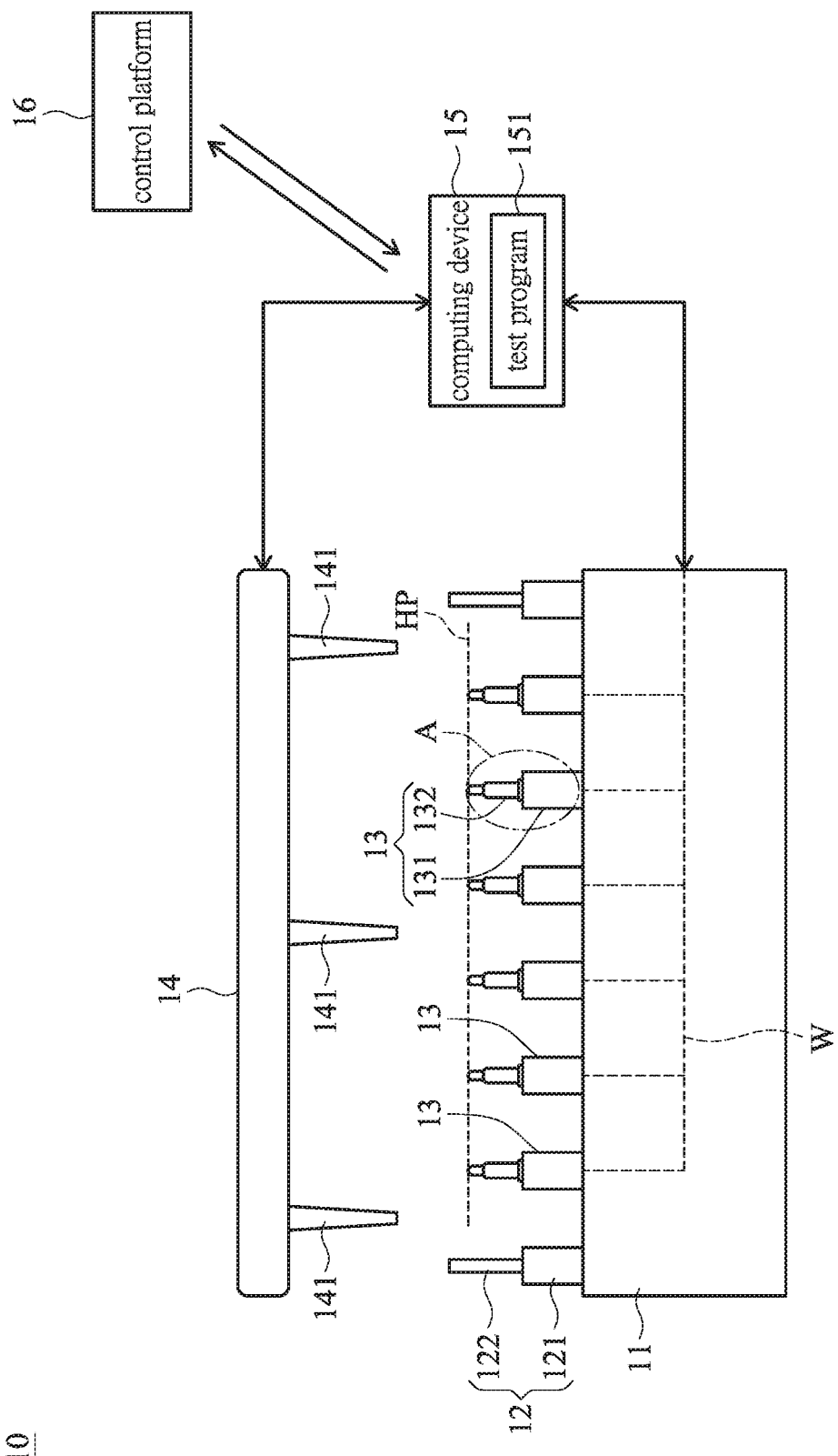
FIG. 1A schematically illustrates the architecture of a circuit test system according to an embodiment of the present invention.
Figure 1B:
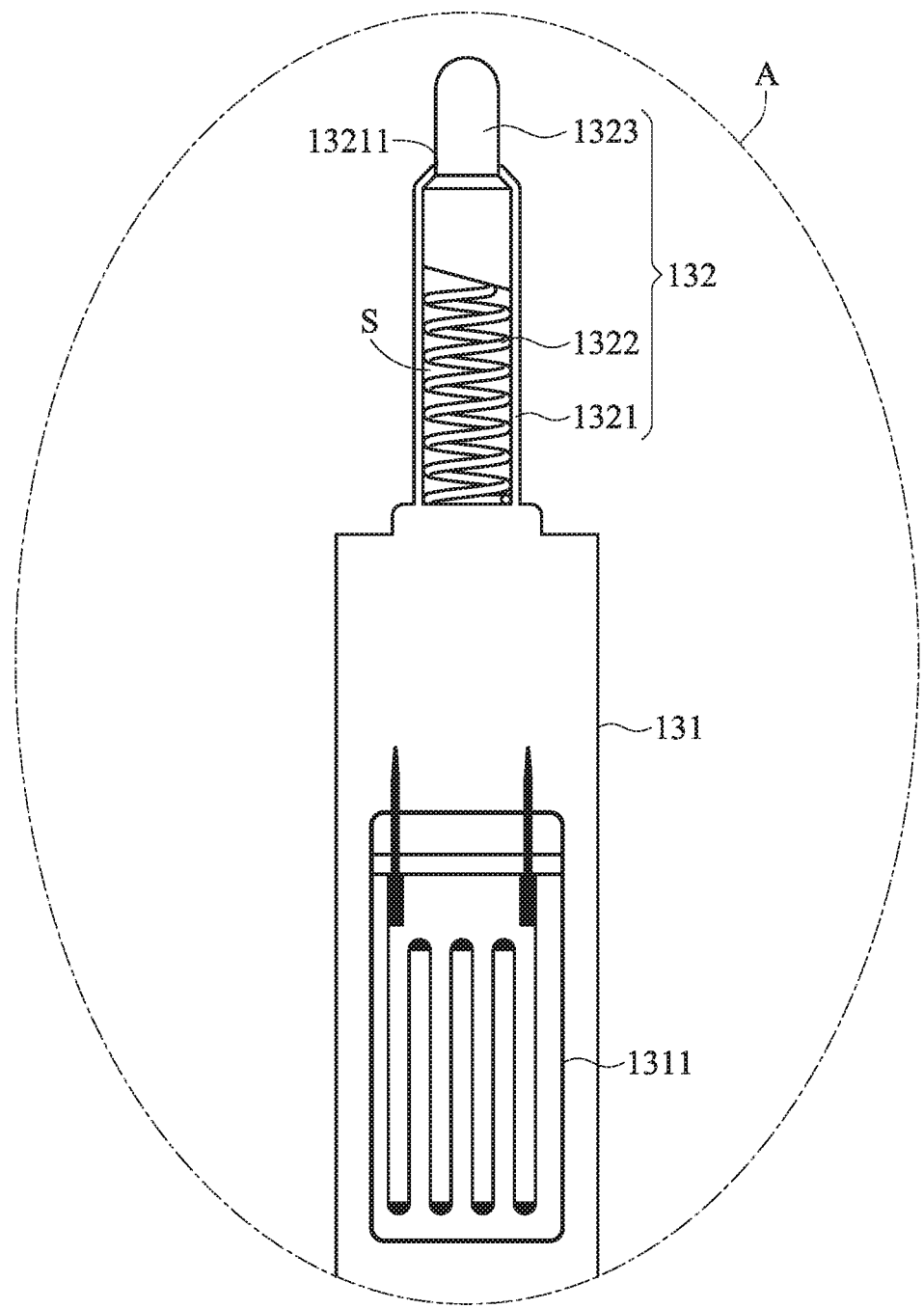
FIG. 1B is a schematic enlarged fragmentary side view illustrating the region A of the circuit test system as shown in FIG. 1A.

Please refer to FIGS. 1A and 1B. FIG. 1A schematically illustrates the architecture of a circuit test system according to an embodiment of the present invention. FIG. 1B is a schematic enlarged fragmentary side view illustrating the region A of the circuit test system as shown in FIG. 1A. The circuit test system 10 is used for testing the circuit of a circuit board. As shown in FIG. 1A, the circuit test system 10 comprises a test platform 11, a pressing plate 14, a computing device 15 and a control platform 16. For assuring the flatness of the test platform 11, the test platform 11 is placed on a flat table or an optical table (not shown). The test platform 11 comprises plural contact elements 13 and plural positioning posts 12. The plural positioning posts 12 are arranged around the plural contact elements 13. Each of the positioning posts 12 comprises a base part 121 and a positioning end 122. The positioning end 122 is coaxially disposed on the base part 121. Moreover, plural elastic pressing posts 141 are protruded from a surface of the pressing plate 14. The elastic pressing posts 141 are used for pressing an under-test circuit board. The computing device 15 is electrically connected with the test platform 11 and the pressing plate 14. A test program 151 is executed in the computing device 15. When the test program 151 is executed, the pressing plate 14 is selectively ascended or descended. Moreover, the test program 151 reads the detection values of the contact elements 13 through a signal circuit W. The computing device 15 is in communication with the control platform 16 in a wired transmission manner or a wireless transmission manner. Consequently, the computing device 15 and the control platform 16 exchange data between each other. An example of the control platform 16 includes but is not limited to a cloud server or a mobile device. For example, the mobile device is a notebook computer, a tablet computer, a personal digital assistant or a smart phone.

The contact elements 13 are disposed on the test platform 11. Please refer to FIG. 1B. The contact element 13 comprises a strain gauge 131 and a pogo pin 132. The strain gauge 131 comprises a strain plate 1311 for detecting the pressure value of the contact element 13. In an embodiment, the pogo pin 132 comprises a main body 1321, a spring 1322 and a plunger 1323. The main body 1321 comprises an opening 13211 and an accommodation space S. The plunger 1323 and the spring 1322 are accommodated within the accommodation space S. A portion of the plunger 1323 is protruded out of the opening 13211. Moreover, the plunger 1323 and the spring 1322 are contacted with each other. As the spring 1322 is compressed or elastically stretched, the plunger 1323 is moved within the accommodation space S in a reciprocating manner. When the contact element 13 is pressed in response to the stress (for example the contact element is pressed by the circuit board 20), the downward displacement of the contact element 13 can be detected by the pogo pin 132 according to the compressed extent of the spring 1322. Moreover, the impedance value of the contact element 13 is detected by the pogo pin 132 through the plunger 1323, and the pressure value of the contact element 13 is detected by the strain plate 1311 of the strain gauge 131. The test program 151 reads the detection values of the contact element 13 (e.g., the pressure value, the downward displacement and the impedance value) through the signal circuit W.

Please refer to FIG. 1A again. Before the process of testing the circuit of the circuit board 20, the detection value of the strain gauge 131 is manually adjusted and calibrated. Consequently, the pressure value detected by the strain gauge 131 is zero. In such way, the pogo pins 132 of the contact elements 13 are located at the same horizontal plane HP. Consequently, the precision of detecting the circuit of the circuit board is enhanced.

Figure 2:
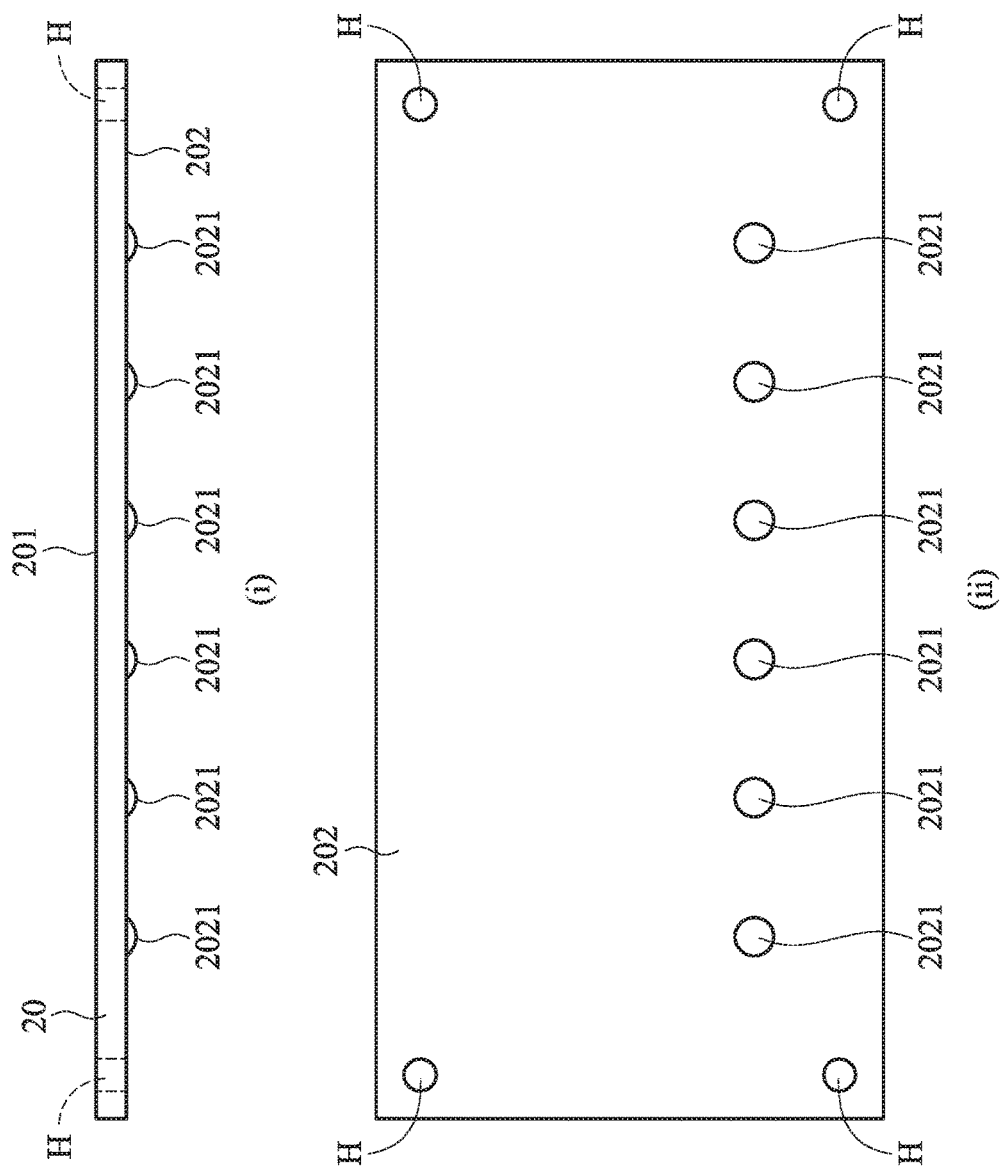
FIG. 2 is a schematic view illustrating the circuit board of the circuit test system according to the embodiment of the present invention.

FIG. 2 is a schematic view illustrating the circuit board of the circuit test system according to the embodiment of the present invention. The drawing (i) of FIG. 2 is a cross-sectional view of the circuit board 20. The drawing (ii) of FIG. 2 is a bottom view of the circuit board 20. The circuit board 20 has a top surface 201 and a bottom surface 202. The circuit board 20 comprises plural positioning holes H. The positioning holes H run through the top surface 201 and the bottom surface 202. Moreover, plural test points 2021 of the under-test circuit (not shown) are formed on the bottom surface 202. The positioning holes H of the circuit board 20 are aligned with the corresponding positioning posts 12. Moreover, the positioning ends 122 of the positioning posts 12 are penetrated through the corresponding positioning holes H (see FIG. 1A).

Figure 3A:
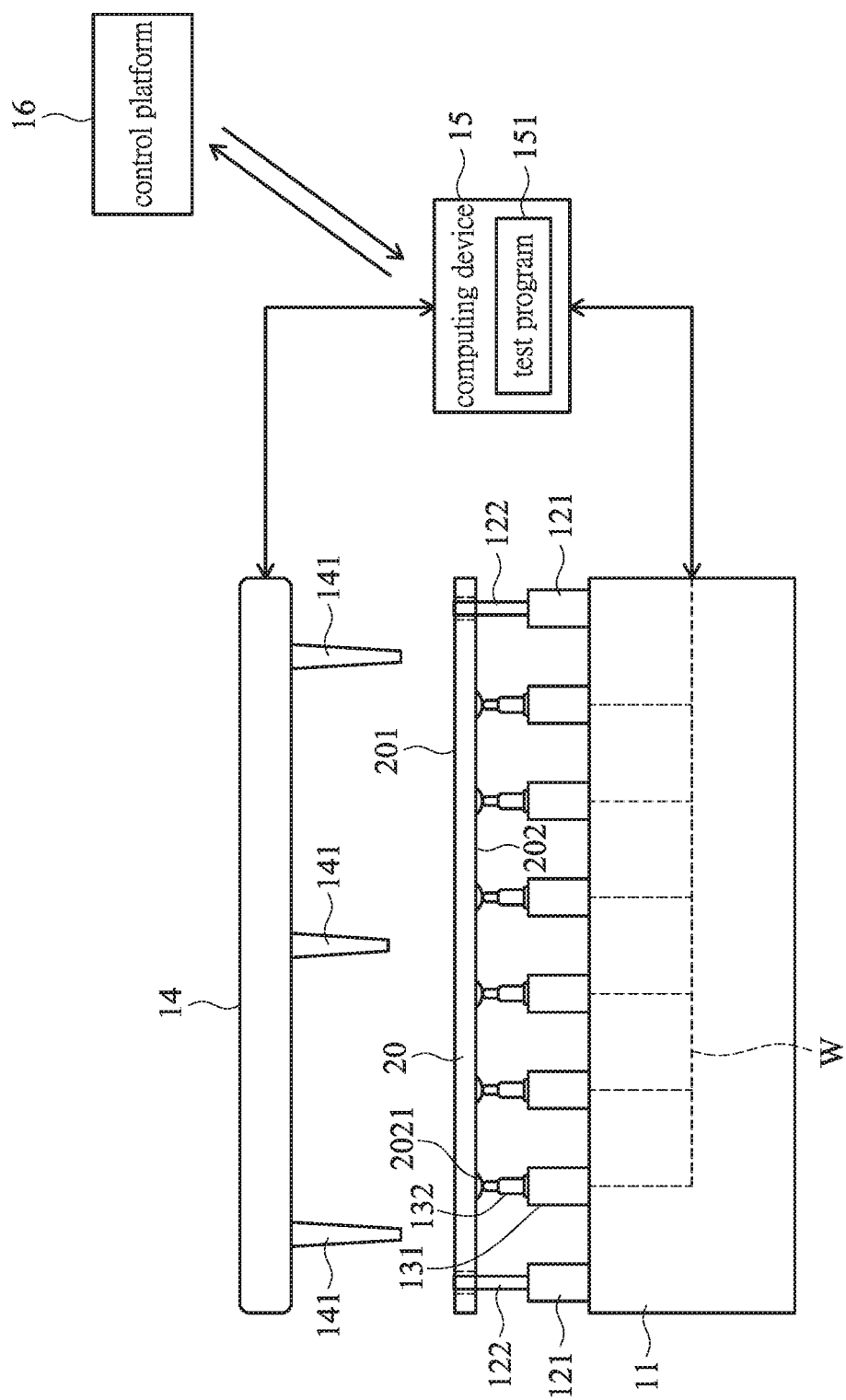
FIGS. 3A and 3B schematically illustrate the use of the circuit test system to test the circuit board.
Figure 3B:
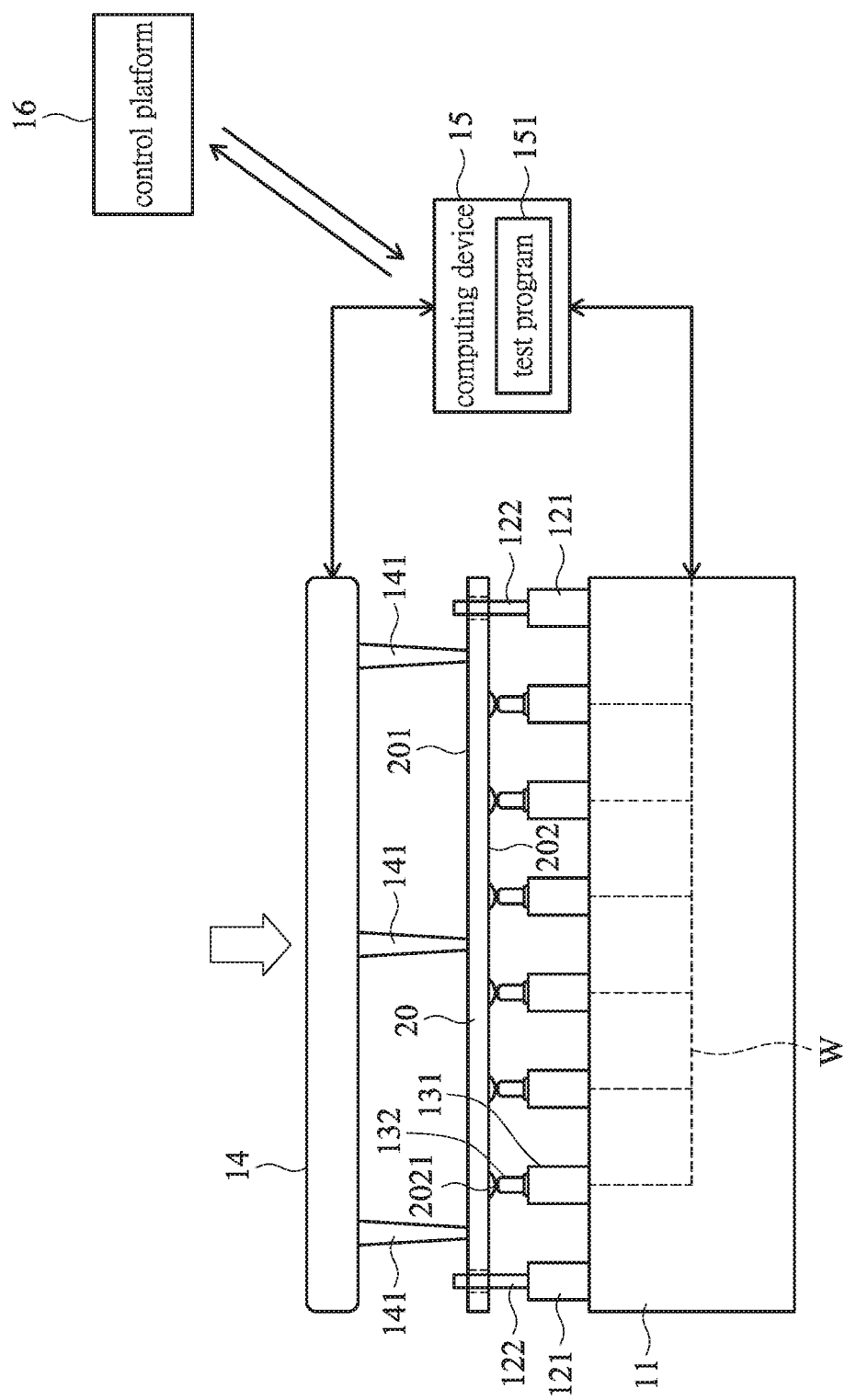

Please refer to FIGS. 3A and 3B. FIGS. 3A and 3B schematically illustrate the use of the circuit test system to test the circuit board. As shown in FIG. 3A, the positioning ends 122 of the positioning posts 12 are penetrated through the corresponding positioning holes H. Consequently, the circuit board 20 is positioned on the contact elements 13. Meanwhile, the pogo pins 132 of the contact elements 13 are electrically contacted with the corresponding test points 2021. Moreover, the circuit board 20 is movable upwardly or downwardly relative to the positioning ends 122 in a reciprocating manner. In case that the circuit board 20 is placed over the contact elements 13 and the top surface 201 of the circuit board 20 is not pressed by the elastic pressing posts 141 of the pressing plate 14, the pogo pins 132 are in a completely-released state. Whereas, in case that the top surface 201 of the circuit board 20 is pressed by the elastic pressing posts 141 of the pressing plate 14 and lowered, the pogo pins 132 are in a completely-compressed state.

Please refer to FIG. 3A. When the circuit board 20 is placed over the contact elements 13 and the circuit board 20 is not pressed by the elastic pressing posts 141 of the pressing plate 14, the pogo pins 132 are in the completely-released state. Meanwhile, the test program 151 reads the pressure value, the downward displacement and the impedance value of the contact element 13 through the signal circuit W. In addition, the pressure value, the downward displacement and the impedance value of each contact element 13 are respectively defined as a standard pressure value, a standard downward displacement and a standard impedance value corresponding to the completely-released state of the pogo pin 132. The standard pressure value, the standard downward displacement and the standard impedance value corresponding to the completely-released state of the pogo pin 132 are stored in the computing device 15.

Please refer to FIG. 3B. When the circuit board 20 is placed on the contact elements 13 and the circuit board 20 is pressed by the elastic pressing posts 141 of the pressing plate 14, the pogo pins 132 are in the completely-compressed state. Meanwhile, the test program 151 reads the pressure value, the downward displacement and the impedance value of the contact element 13 through the signal circuit W. In addition, the pressure value, the downward displacement and the impedance value of the contact element 13 are respectively defined as a standard pressure value, a standard downward displacement and a standard impedance value corresponding to the completely-compressed state of the pogo pins 132. The standard pressure value, the standard downward displacement and the standard impedance value corresponding to the completely-compressed state of the pogo pins 132 are stored in the computing device 15.

Please refer to FIG. 3B. When the process of testing the circuit board 20 starts, the standard pressure value, the standard downward displacement and the standard impedance value corresponding to the completely-released state of the pogo pin 132 and the standard pressure value, the standard downward displacement and the standard impedance value corresponding to the completely-compressed state of the pogo pin 132 are loaded into the test program 151. Then, the test program 151 controls the contact elements 13 to be in electrical contact with the test points 2021 in order to test the circuit of the circuit board 20. According to the result of testing the circuit, a test record is generated and stored in the computing device 15.

During the process of testing the circuit of the circuit board 20, the test program 151 also monitors and reads the pressure value, the downward displacement and the impedance value of the contact element 13 through the signal circuit W. Moreover, according to the result of comparing the pressure value, the downward displacement and the impedance value of each contact element 13 with the standard pressure value, the standard downward displacement and the standard impedance value, the test program 151 judges whether the contact element 13 is normally operated or the pogo pin 132 is accurately in electrical contact with the corresponding test point 2021. For example, when the circuit board 20 is pressed by the elastic pressing posts 141 of the pressing plate 14 in the process of testing the circuit of the circuit board 20, the contact elements 13 are pressed by the test points 2021 and the pogo pins 132 are completely compressed. Meanwhile, the test program 151 monitors and reads the pressure value, the downward displacement and the impedance value of the contact element 13 corresponding to the completely-compressed state of the pogo pins 132 through the signal circuit W. Moreover, the test program 151 judges whether the pressure value, the downward displacement and the impedance value of the contact element 13 corresponding to the completely-compressed state of the pogo pin 132 are respectively equal to the loaded standard pressure value, the loaded standard downward displacement and the loaded standard impedance value corresponding to the completely-compressed state of the pogo pins 132.

In a situation, the pogo pins 132 are accurately in electrical contact with the test points 2021. If the pressure value of the contact element 13 is not equal to the loaded standard pressure value, it means that the detecting function of the strain gauge 131 of the contact element 13 is abnormal. If the downward displacement of the contact element 13 is not equal to the loaded standard downward displacement, it means that the detecting function of the spring 1322 of the contact element 13 is abnormal. If the impedance value of the contact element 13 is not equal to the loaded standard impedance value, it means that the function of the plunger 1323 of the contact element 13 is abnormal. In another situation, the pogo pins 132 are accurately in electrical contact with the test points 2021. Under this circumstance, the pressure value of the contact element 13 is not equal to the loaded standard pressure value, the downward displacement of the contact element 13 is not equal to the loaded standard downward displacement, or the impedance value of the contact element 13 is not equal to the loaded standard impedance value. According to the result of comparing the pressure value, the downward displacement and the impedance value with the standard pressure value, the standard downward displacement and the standard impedance value, the test program 151 generates an abnormal signal and stores the abnormal signal in the computing device 15. Moreover, the abnormal signal is shown on a display device (not shown) of the computing device 15 to prompt the test worker. According to the information of the abnormal signal (e.g., the abnormal detection value of the strain gauge 131, the abnormal detection value of the spring 1322 or the abnormal detection value of the plunger 1323), the test worker may adjust the placement position of the circuit board 20 or calibrate or replace the abnormal component of the contact element 13.

Similarly, when the circuit board 20 is not pressed by the elastic pressing posts 141 of the pressing plate 14 in the process of testing the circuit of the circuit board 20, the pogo pins 132 are completely released. Meanwhile, the test program 151 monitors and reads the pressure value, the downward displacement and the impedance value of the contact element 13 corresponding to the completely-released state of the pogo pin 132 through the signal circuit W. Moreover, the test program 151 judges whether the pressure value, the downward displacement and the impedance value of the contact element 13 corresponding to the completely-released state of the pogo pin 132 are respectively equal to the loaded standard pressure value, the loaded standard downward displacement and the loaded standard impedance value corresponding to the completely-released state of the pogo pin 132.

Please refer to FIGS. 3A and 3B again. After the process of testing the circuit of the circuit board 20 is completed or the detecting result indicates that the contact element 13 is abnormal, the test record or the abnormal signal stored in the computing device 15 is transmitted to the control platform 16 by the test program 151 in the wired transmission manner or the wireless transmission manner. Consequently, the supervisor in the production line of the control platform 16 can immediately monitor the testing condition of the circuit board 20 in the production line through the control platform 16.

Figure 4A:
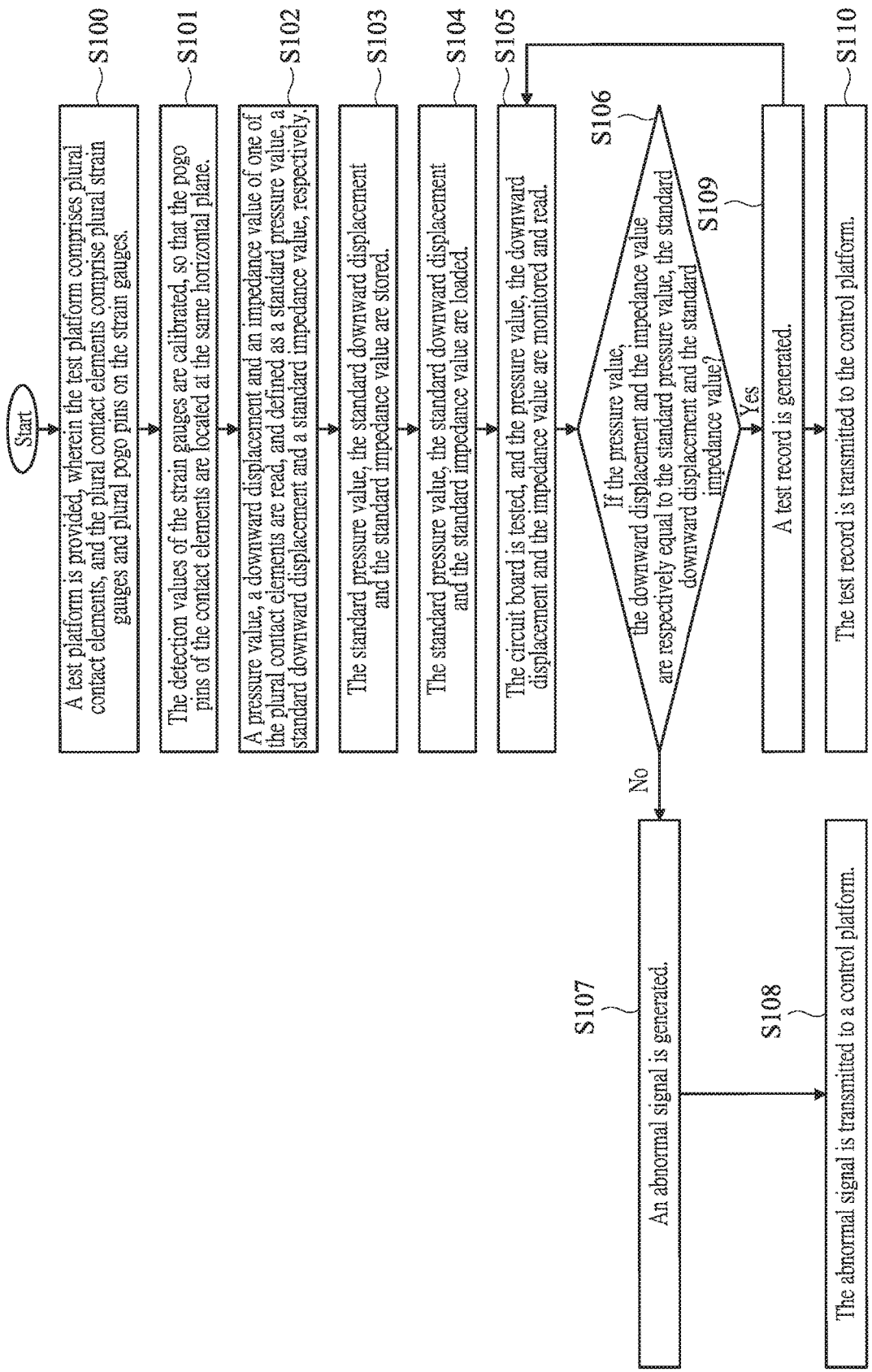
FIG. 4A is a flowchart illustrating a test method for a circuit test system according to the embodiment of the present invention.

FIG. 4A is a flowchart illustrating a test method for a circuit test system according to the embodiment of the present invention. Please refer to FIGS. 1A, 1B, 2, 3A, 3B and 4A. Firstly, a test platform 11 is provided, wherein the test platform 11 comprises plural contact elements 13, and the plural contact elements 13 comprise respective strain gauges 131 and respective pogo pins 132 on the strain gauges 131 (Step S100). In the step S100, the contact elements 13 are disposed on the test platform 11, and each contact element 13 comprises a strain gauge 131 and a pogo pin 132. When the contact element 13 is pressed in response to the stress, a downward displacement and an impedance value of the contact element 13 are detected by the pogo pin 132 and the pressure value of the contact element 13 is detected by the strain gauge 131. Moreover, the test program 151 reads the detection values of the contact elements 13 through a signal circuit W.

Then, the detection values of the strain gauge 131 are calibrated, so that the pogo pins 132 of the contact elements 13 are located at the same horizontal plane HP (Step S101). In the step S101, the detection value of the strain gauge 131 is manually adjusted and calibrated. Consequently, the pressure value detected by the strain gauge 131 is zero. In such way, the pogo pins 132 of the contact elements 13 are located at the same horizontal plane HP.

Then, the test program 151 reads a pressure value, a downward displacement and an impedance value of the contact element 13 as a standard pressure value, a standard downward displacement and a standard impedance value (Step S102), and stores the standard pressure value, the standard downward displacement and the standard impedance value (Step S103). In the step S102 and the step S103, the test program 151 reads the pressure value, the downward displacement and the impedance value of the contact element 13 through a signal circuit W. The pressure value, the downward displacement and the impedance value of the contact element 13 are defined as the standard pressure value, the standard downward displacement and the standard impedance value of the contact element 13. Moreover, the standard pressure value, the standard downward displacement and the standard impedance value are stored in the computing device 15.

Then, the standard pressure value, the standard downward displacement and the standard impedance value are loaded (Step S104). Then, the circuit board 20 is tested, and the pressure value, the downward displacement and the impedance value of the contact element 13 are monitored and read (Step S105). When the process of testing the circuit board 20 starts, the test program 151 loads the standard pressure value, the standard downward displacement and the standard impedance value of the contact element 13 from the computing device 15. In addition, the test program 151 monitors and reads the detection values of the contact element 13 through the signal circuit W.

Then, the test program 151 judges whether the pressure value, the downward displacement and the impedance value of the contact element 13 are respectively equal to the standard pressure value, the standard downward displacement and the standard impedance value (Step S106). In the step S106, the test program 151 monitors and reads the pressure value, the downward displacement and the impedance value of the contact element 13 through the signal circuit W, and the test program 151 judges whether the pressure value, the downward displacement and the impedance value of the contact element 13 are respectively equal to the loaded standard pressure value, the loaded standard downward displacement and the loaded standard impedance value. According to the comparing result, the test program 151 judges whether the contact element 13 is normally operated or the pogo pin 132 is accurately in electrical contact with the corresponding test point 2021.

If the judging condition of the step S106 is not satisfied, an abnormal signal is generated (Step S107). In the step S107, the test program 151 generates the abnormal signal according to the result of comparing the pressure value, the downward displacement and the impedance value of the contact element 13 with the standard pressure value, the standard downward displacement and the standard impedance value, and stores the abnormal signal into the computing device 15. Moreover, the abnormal signal is shown on a display device (not shown) of the computing device 15 to prompt the test worker. According to the information of the abnormal signal, the test worker may adjust the placement position of the circuit board 20 or calibrate or replace the abnormal component of the contact element 13. In addition, the abnormal signal is transmitted to a control platform 16 (Step S108). In the step S108, the abnormal signal stored in the computing device 15 is transmitted to the control platform 16 by the test program 151 in the wired transmission manner or the wireless transmission manner. Consequently, the supervisor in the production line of the control platform 16 can immediately monitor the testing condition of the circuit board 20 in the production line through the control platform 16.

If the judging condition of the step S106 is satisfied, a test record is generated (Step S109) and the test record is transmitted to the control platform 16 (Step S110). In the step S109 and the step S110, the test program 151 generates the test record according to the result of detecting the circuit of the circuit board 20 and stores the test record into the computing device 15. Moreover, the test record stored in the computing device 15 is transmitted to the control platform 16 by the test program 151 in the wired transmission manner or the wireless transmission manner. Consequently, the supervisor in the production line of the control platform 16 can immediately monitor the testing condition of the circuit board 20 in the production line through the control platform 16.

Figure 4B:
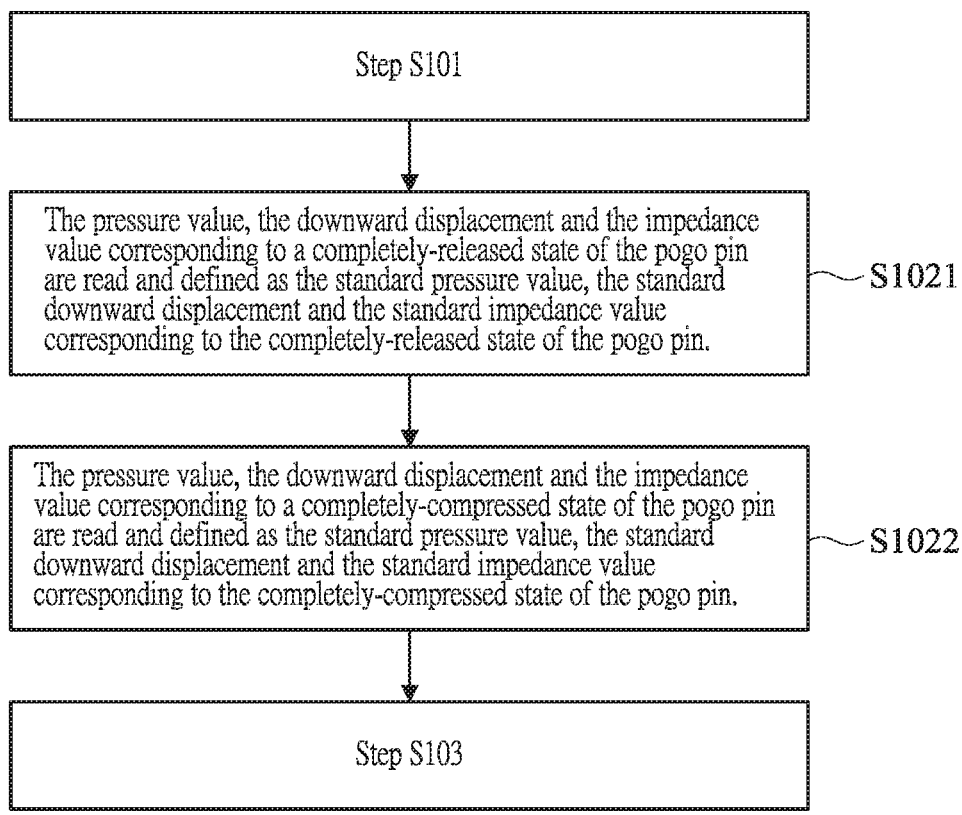
FIG. 4B is a flowchart illustrating the step S102 of the circuit test method of FIG. 4A.

Please refer to FIG. 4B. FIG. 4B is a flowchart illustrating the step S102 of the circuit test method of FIG. 4A. As shown in FIG. 4B, the step S102 comprises a step S1021 and a step S1022. In the step S1021, the pressure value, the downward displacement and the impedance value of the contact element 13 corresponding to a completely-released state of the pogo pin 132 are read and defined as the standard pressure value, the standard downward displacement and the standard impedance value corresponding to the completely-released state of the pogo pin 132. In the step S1022, the pressure value, the downward displacement and the impedance value of the contact element 13 corresponding to a completely-compressed state of the pogo pin 132 are read and defined as the standard pressure value, the standard downward displacement and the standard impedance value corresponding to the completely-compressed state of the pogo pin 132. In case that the circuit board 20 is placed over the contact elements 13 and the circuit board 20 is not pressed by the elastic pressing posts 141 of the pressing plate 14, the pogo pins 132 are in a completely-released state. Whereas, in case that the circuit board 20 is pressed by the elastic pressing posts 141 of the pressing plate 14 and lowered, the pogo pins 132 are in a completely-compressed state.

When the circuit board 20 is placed over the contact elements 13 and the circuit board 20 is not pressed by the elastic pressing posts 141 of the pressing plate 14, the pogo pins 132 are in a completely-released state. Meanwhile, the test program 151 reads the pressure value, the downward displacement and the impedance value of each contact element 13 through the signal circuit W. In addition, the pressure value, the downward displacement and the impedance value of the contact element 13 are respectively defined as the standard pressure value, the standard downward displacement and the standard impedance value corresponding to the completely-released state of the pogo pin 132. The standard pressure value, the standard downward displacement and the standard impedance value corresponding to the completely-released state of the pogo pins 132 are stored in the computing device 15. When the circuit board 20 is placed on the contact elements 13 and the circuit board 20 is pressed and lowered by the elastic pressing posts 141 of the pressing plate 14, the pogo pins 132 are in the completely-compressed state. Meanwhile, the test program 151 reads the pressure value, the downward displacement and the impedance value of each contact element 13 through the signal circuit W. In addition, the pressure value, the downward displacement and the impedance value of the contact element 13 are respectively defined as the standard pressure value, the standard downward displacement and the standard impedance value corresponding to the completely-compressed state of the pogo pins 132. The standard pressure value, the standard downward displacement and the standard impedance value corresponding to the completely-compressed state of the pogo pins 132 are stored in the computing device 15. During the process of testing the circuit of the circuit board 20, the test program 151 also monitors and reads the pressure value, the downward displacement and the impedance value of the contact element 13 through the signal circuit W. Moreover, according to the result of comparing the pressure value, the downward displacement and the impedance value of each contact element 13 with the standard pressure value, the standard downward displacement and the standard impedance value, the test program 151 judges whether the contact element 13 is normally operated or the pogo pin 132 is accurately in electrical contact with the corresponding test point 2021.

From the above descriptions, the present invention provides a circuit test system. By the circuit test system, the circuit board is placed flat on the test platform. During the process of testing the circuit of the circuit board, the circuit test system is capable of monitoring whether the contact element is normally operated and assuring that the contact element is accurately in electrical contact with the circuit board. In other words, the circuit test system and the circuit test method of the present invention are industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A circuit test system for testing a circuit of a circuit board, plural test points being formed on the circuit of the circuit board, the circuit test system comprising:
   a test platform comprising plural contact elements corresponding to the plural test points, wherein each of the plural contact elements comprises a strain gauge and a pogo pin, wherein a pressure value of each of the plural contact elements is detected by the corresponding strain gauge, the pogo pin is disposed on the strain gauge, a downward displacement and an impedance value of each of the plural contact elements are detected by the pogo pin, and the pogo pin is electrically contacted with the corresponding test point;
   a pressing plate, wherein when the circuit board is pressed by the pressing plate, the plural contact elements are pressed by the corresponding test points; and
   a computing device electrically connected with the test platform and the pressing plate, wherein a test program is executed in the computing device,
   wherein when the plural contact elements are electrically contacted with the corresponding test points to test the circuit of the circuit board, the test program monitors and reads the pressure value, the downward displacement and the impedance value and judges whether the pressure value, the downward displacement and the impedance value are equal to a standard pressure value, a standard downward displacement and a standard impedance value, respectively.

2. The circuit test system according to claim 1, wherein the strain gauge comprises a strain plate that detects the pressure value.

3. The circuit test system according to claim 1, wherein the pogo pin comprises:
   a plunger detecting the impedance value;
   a spring detecting the downward displacement; and
   a main body comprising an opening and an accommodation space, wherein the plunger and the spring are accommodated within the accommodation space, and a portion of the plunger is protruded out of the opening and contacted with the spring, so that the plunger is movable within the accommodation space in a reciprocating manner.

4. The circuit test system according to claim 1, wherein when the pogo pin of each contact element is in a completely-released state, the pressure value, the downward displacement and the impedance value read by the test program are respectively defined as the standard pressure value, the standard downward displacement and the standard impedance value corresponding to the completely-released state of the pogo pin.

5. The circuit test system according to claim 1, wherein when the pogo pin of each contact element is in a completely-compressed state, the pressure value, the downward displacement and the impedance value read by the test program are respectively defined as the standard pressure value, the standard downward displacement and the standard impedance value corresponding to the completely-compressed state of the pogo pin.

6. The circuit test system according to claim 1, wherein the test platform comprises plural positioning posts, which are arranged around the plural contact elements, wherein the circuit board comprises plural positioning holes corresponding to the plural positioning posts, and the plural positioning posts are penetrated through the corresponding positioning holes, so that the circuit board is positioned over the plural contact elements.

7. The circuit test system according to claim 6, wherein the plural positioning posts comprise respective base parts and respective positioning ends, wherein the positioning ends are coaxially disposed on the corresponding base parts.

8. The circuit test system according to claim 7, wherein the positioning ends of the positioning posts are penetrated through the corresponding positioning holes, so that the circuit board is movable relative to the positioning ends in a reciprocating manner.

9. The circuit test system according to claim 1, wherein when the test program controls the contact elements to be electrically contacted with the corresponding test points to test the circuit of the circuit board, a test record is generated and stored in the computing device.

10. The circuit test system according to claim 9, wherein if the test program judges that the pressure value, the downward displacement and the impedance value of each of the plural contact elements are not respectively equal to the standard pressure value, the standard downward displacement and the standard impedance value, an abnormal signal is generated and stored in the computing device.

11. The circuit test system according to claim 10, wherein the circuit test system further comprises a control platform, and the test record or the abnormal signal is transmitted from the test program to the control platform in a wired transmission manner or a wireless transmission manner.

12. The circuit test system according to claim 11, wherein the control platform is a cloud server or a mobile device.

13. The circuit test system according to claim 12, wherein the mobile device is a notebook computer, a tablet computer, a personal digital assistant or a smart phone.

14. The circuit test system according to claim 1, wherein plural elastic pressing posts are protruded from a surface of the pressing plate, wherein when the circuit board is pressed by the elastic pressing posts, the plural contact elements are pressed by the corresponding test points.

15. A circuit test method for testing a circuit of a circuit board, plural test points being formed on the circuit of the circuit board, the circuit test method comprising steps of:
   (a) providing a test platform, wherein the test platform comprises plural contact elements, and the plural contact elements comprise plural strain gauges and plural pogo pins on the corresponding strain gauges;
   (b) calibrating detection values of the strain gauges, so that the pogo pins of the contact elements are located at the same horizontal plane;
   (c) reading a pressure value, a downward displacement and an impedance value of each of the plural contact elements, and defining the pressure value, the downward displacement and the impedance value as a standard pressure value, a standard downward displacement and a standard impedance value, respectively;
   (d) storing the standard pressure value, the standard downward displacement and the standard impedance value;
   (e) loading the standard pressure value, the standard downward displacement and the standard impedance value;
   (f) testing the circuit board, and monitoring and reading the pressure value, the downward displacement and the impedance value of each of the plural contact elements;
   (g) judging whether the pressure value, the downward displacement and the impedance value of each of the plural contact elements are respectively equal to the standard pressure value, the standard downward displacement and the standard impedance value, wherein if the judging condition of the step (g) is not satisfied, an abnormal signal is generated, wherein if the judging condition of the step (g) is satisfied, a next step is performed; and (h) generating a test record.

16. The circuit test method according to claim 15, wherein in the step (g), the abnormal signal is transmitted to a control platform in a wired transmission manner or a wireless transmission manner.

17. The circuit test method according to claim 15, wherein in the step (h), the test record is transmitted to a control platform in a wired transmission manner or a wireless transmission manner.

18. The circuit test method according to claim 15, wherein in the step (c), the pressure value, the downward displacement and the impedance value of each contact element corresponding to a completely-released state of the pogo pin are read and defined as the standard pressure value, the standard downward displacement and the standard impedance value corresponding to the completely-released state of the pogo pin.

19. The circuit test method according to claim 15, wherein in the step (c), the pressure value, the downward displacement and the impedance value of each contact element corresponding to a completely-compressed state of the pogo pin are read and defined as the standard pressure value, the standard downward displacement and the standard impedance value corresponding to the completely-compressed state of the pogo pin.

* * * * *